United States Patent

[11] 3,569,838

[72] Inventors David J. Blair Snyder; George H. Kam, Tonawanda, N.Y.

[21] Appl. No. 718,532
[22] Filed Apr. 3, 1968
[45] Patented Mar. 9, 1971
[73] Assignee Sylvania Electric Products Inc.

[54] WIDE RANGE FREQUENCY SYNTHESIZER
7 Claims, 2 Drawing Figs.

[52] U.S. Cl. ........................................................ 325/184, 325/423, 325/433, 331/177
[51] Int. Cl. ........................................................ H04b 1/04
[50] Field of Search ............................................ 325/421, 417, 423, 433, 453, 184, 335; 331/18, 19, 30, 48, 177, 178, 179

[56] References Cited

UNITED STATES PATENTS

| | | | |
|---|---|---|---|
| 2,581,594 | 1/1952 | MacSorley ................... | 325/421X |
| 2,595,608 | 5/1952 | Robinson et al. ............. | 325/421X |
| 3,032,650 | 5/1962 | Mathison et al. ............. | 325/421X |
| 3,379,976 | 4/1968 | Niedereder .................. | 331/178X |
| 3,409,836 | 11/1968 | Wallett ......................... | 325/453X |

*Primary Examiner*—Robert L. Griffin
*Assistant Examiner*—R. S. Bell
*Attorneys*—Norman J. O'Malley, Elmer J. Nealon and Edward J. Coleman

ABSTRACT: A frequency synthesizer particularly suitable for VHF applications comprising a pair of variable frequency oscillators adapted to be simultaneously tuned in coarse frequency steps, one of the oscillators being phase locked to a frequency standard, and the second oscillator being controlled by a tunable frequency lock loop referenced to the first oscillator to provide the synthesized frequency output. The tunable frequency lock loop includes a balanced mixer coupled at the outputs of the two oscillators for producing a difference frequency, a frequency discriminator for providing a voltage signal proportional to this difference frequency, a continuously or discretely variable tuning voltage, and a difference amplifier which compares the discriminator output with a selected tuning voltage and provides a difference signal for fine tuning the second oscillator.

INVENTORS
David J. Blair & George H. Kam
BY Edward J. Coleman
AGENT.

WIDE RANGE FREQUENCY SYNTHESIZER

BACKGROUND OF THE INVENTION

This invention relates to frequency synthesizers and more particularly to an improved frequency synthesizer which is continuously of discretely variable over a wide frequency range and particularly suitably for very high-frequency (VHF) applications.

At lower frequency levels, of the order of 1 m.c.p.s., a voltage controlled oscillator can provide a relatively stable source of variable frequencies. In the VHF range (30 to 300 m.c.p.s.); however, a variable frequency oscillator, having the same percentage of stability will exhibit a maximum frequency deviation which is *n* times greater than that for the lower frequency oscillator, where *n* is the ratio of the nominal frequency of the higher frequency oscillator with respect to that of the lower frequency oscillator. For example, assuming a 1 percent tuning accuracy, which is generally not too difficult to achieve, a 1 m.c.p.s. variable frequency oscillator may be set to a given frequency plus or minus 10 m.c.p.s., whereas a 100 m.c.p.s. variable frequency oscillator can only be controlled to plus or minus 1 m.c.p.s. With greater tuning accuracies, cost and complexity increase rapidly. Such a degradation in the absolute frequency stability severely limits frequency resolution, or channel spacing, and is quite undesirable in many applications. As a consequence, VHF variable frequency sources are generally derived from or referenced to a highly stable frequency standard, such as a precision crystal oscillator. At the present time, there are three methods of VHF frequency synthesis in general use which may be categorized as direct, indirect and hybrid.

The direct synthesis technique employs one or more precision crystal oscillators and a plurality of mixers arranged to obtain and combine harmonics and subharmonics of the oscillators to make available a multiplicity of output signals harmonically related to the crystal oscillator sources. One disadvantage of these harmonic generator methods is the unavoidable generation of spurious frequencies in the combining mixers. Selection of the desired harmonic frequency while simultaneously rejecting the adjacent undesired harmonics and spurious frequencies is a difficult problem which requires extensive filtering. Such filtering becomes more extensive as the channel spacing is decreased. Furthermore, a number of signal frequencies that a harmonic generator is capable of providing is restricted by the actual number of harmonics and subharmonics available. Finally, the complexity and power and packaging requirements of a direct synthesizer are prohibitive in portable and avionic radio applications.

Indirect frequency synthesizers provide significant advantages over direct synthesizers in economy, reduced complexity, flexibility, and reduced size, weight and power requirements. The typical indirect synthesizer consists of a variable frequency oscillator (VFO) having a phase lock loop which is referenced to a frequency standard and includes a variable frequency divider. The VFO output is fed back through the variable divider to a phase detector in which the divided down frequency is compared with the reference frequency. The resulting error signal is applied through a low pass filter to control and correct the VFO. Different output frequencies are selected by changing the feedback path frequency division ratio, If division by whole numbers is used, however, the system is limited in the minimum channel spacing achievable with any given reference frequency. Thus, for example, if an 82—110 m.c.p.s. output channelized in 100 c.p.s. is desired, and a 1000 c.p.s. reference frequency is used, the minimum number of cycles per second obtainable between adjacent output frequencies would be 1,000 by using whole integer division, since this is the lowest common denominator of all of the output frequencies. It can quite readily be seen, then, that the 100 c.p.s. steps in frequency output cannot be obtained with such a system.

In some applications this channel-spacing limitation has been overcome by using digital fractional division, rather than the whole integer division, to achieve the phase lock within a loop; e.g. see U.S. Pat. No 3,217,267. Implementation of a digital fractional divider, however, requires a significant increase in cost and circuit complexity. Of course, closer channel spacing with whole integer division can be achieved by merely reducing the reference frequency. This approach, however, requires a corresponding reduction in the cutoff point of the low pass filter, which in turn reduces loop response time. The slower loop response has the undesirable effects of increasing the lockup time, requiring greater short term stability from the VFO, and reducing the capture range of the loop. For channel spacing less than 100 c.p.s. these problems become acute.

An approach which has been used to increase resolution without reducing the reference frequency or using a fractional divider is to divide the synthesizer output to provide the desired resolution and then use heterodyning to restore the output frequency to the desired range. The disadvantages, however, are increased circuit complexity and a difficult filtering problem at the output of the heterodyne mixer. An improvement over this approach is to use a mixer and multiplier in the loop, rather than a divider and heterodyne process at the synthesizer output. The VFO output is mixed with a fixed frequency selected to provide a difference frequency at the mixer output which is a subharmonic of the VFO output. The mixer output is then multiplied back up to the VFO frequency for application to the loop divider, a process which also causes the high resolution frequency difference between channels to be multiplied up to the loop reference frequency. This technique, however, also increases circuit complexity, especially for wide tuning ranges which require two or more stages of mixers and multipliers for practical implementation.

The third frequency synthesis technique presently employed in VHF ranges in a hybrid system whereby the output of a high frequency crystal oscillator, at the desired VHF nominal frequency, is mixed with the output of a low frequency VFO. In this way the stability of the crystal oscillator is blended with the closer channel spacing obtainable from a low frequency VFO. A significant disadvantage of this system, however, is the extremely critical high-frequency filtering required at the mixer output. Further, to provide a wide frequency range, a bank of crystals is required, along with appropriate switching circuits, thereby adding significantly to cost and circuit complexity.

A significant disadvantage of all of the prior art frequency synthesizers lies in the complex tuning mechanisms employed to enable an operator to vary the synthesizer frequency; such devices typically comprise combinations of multipole switches, complex mechanical linkages, Geneva gear trains, etc., all of which add to make the synthesizer a relatively costly and bulky package.

SUMMARY OF THE INVENTION

In accordance with the present invention, frequency synthesis is provided by a variable frequency oscillator which is fine tuned by a continuously or discretely tunable frequency lock loop coupled to a stable reference frequency source and step tuned in coarse frequency steps by a steering voltage source which simultaneously controls the reference frequency. The tunable frequency lock loop comprises a balanced mixer for obtaining the different frequency of the variable oscillator and the reference frequency source, a frequency discriminator, preferably comprising a monostable and integrator, for providing voltage signal proportional to this difference frequency, a variable turning voltage source, and a difference amplifier for comparing the discriminator output voltage with the tuning voltage and providing a difference signal to fine tune the variable frequency oscillator. The variable oscillator is prevented from locking onto the reference frequency by calibrating the variable tuning voltage source to provide a minimum frequency difference therebetween. In a preferred embodiment, the stable reference frequency source comprises a variable frequency oscillator which is phase locked to a selected harmonic of a frequency standard.

The tuning functions of the present invention may be provided by simple potentiometer and resistor decade voltage dividers connected to a suitable supply voltage source. The combination of step tuning and frequency lock loop fine tuning permits not only very close channel spacing, but enables continuous tuning over a wide range at very high frequencies. Good short term stability is maintained by the open loop control provided in coupling a stable reference frequency source to the frequency lock loop, while the use of the low difference frequency from the balanced mixer avoids the filter problems associated with high frequency processing. In short, the invention provides significant advantages over prior art synthesizers by achieving continuous wide range tuning at VHF in a relatively stable synthesizer circuit which it considerably more economical, simplified and compact than heretofore provided.

BRIEF DESCRIPTION OF THE DRAWINGS

The invention will be more fully understood from the following detailed description taken in conjunction with the accompanying drawings in which.

DETAILED DESCRIPTION OF THE INVENTION

Figures 1, 2:
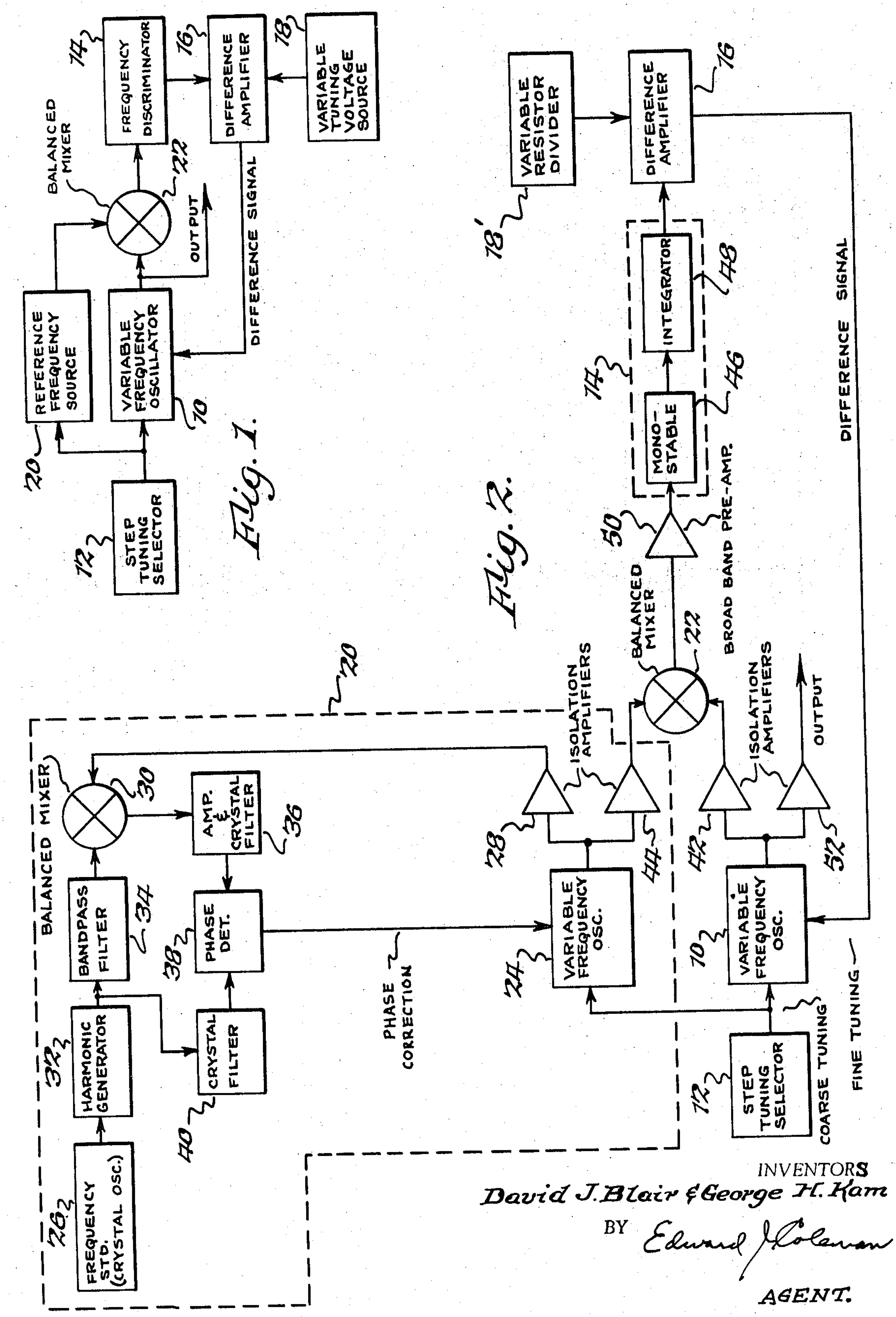
FIG. 1 is a simplified block diagram of a frequency synthesizer according to the present invention.
FIG. 2 is a more detailed block diagram of a preferred embodiment of a frequency synthesizer according to the invention.

The principle of the present invention is best illustrated by the simplified block diagram of FIG. 1. The synthesized frequencies are generated by a variable frequency oscillator (VFO) 10 which is controlled by both coarse and fine tuning signals. The coarse tuning signal is provided by a step variable source of direct current steering voltage denoted as step tuning selector 12. Fine tuning is provided by a tunable frequency lock loop which includes a frequency discriminator 14 and a difference amplifier 16 for comparing the discriminator output voltage level with that from a variable tuning voltage source 18. The resulting difference signal is connected to fine tune the variable oscillator 10. To provide the requisite stability at high operating frequencies, the frequency lock loop is coupled to a stable reference frequency source 20 by means of a balanced mixer 22, which is coupled at the outputs of variable oscillator 10 and reference source 20. Mixer 22 is operative to produce as the loop feedback signal the difference frequency of the oscillator 10 and reference source 20 inputs thereto. Frequency discriminator 14 converts this difference frequency to a proportional direct current voltage signal. The difference signal from amplifier 16 corrects the frequency of oscillator 10 to produce a difference frequency from mixer 22 which yields a discriminator voltage signal level equal to the voltage setting of tuning source 18. Variation tuning voltage source 18, therefore, enables variation of the frequency difference between oscillator 10 and reference source 20 and provides means for continuously or discretely varying the output of oscillator 10.

If oscillator 10 is tuned at or near the frequency of reference source 20, it will have a natural tendency to lock onto the reference frequency. To preclude this undesirable affect, the variable tuning source 18 is calibrated to provide a minimum frequency offset between oscillator 10 and reference source 20. Tuning source 18 may otherwise vary the frequency of oscillator 10 to provide any difference frequency beyond this minimum required to prevent mutual lock on. If the difference frequency is too high, however, the filtering at the output of mixer 22 becomes quite critical. As a consequence, the variable tuning source 18 has a limited band spread, if the advantage of simple filtering is to be retained. To provide a wide range tuning, therefore, reference source 20 is adapted to be varied in frequency by an applied tuning signal, and step tuning selector 12 is connected to simultaneously tune both the variable oscillator 10 and reference source 20 in coarse frequency steps. Thus, if oscillator 10 and reference source 20 are designed to provide VHF outputs, and if each coarse tuning frequency step up is equal to the band spread of variable tuning source 18, the synthesizer of FIG. 1 provides a very simplified circuit design for obtaining a continuously variable frequency output over a wide range at VHF with good absolute frequency stability.

FIG. 2 illustrates in more detail a preferred embodiment of the present invention. To enable a clearer understanding the circuit will be described as implemented for a specific application of the type for which the invention is particularly well suited, namely, for providing a continuously tunable frequency output from 82.5 m.c.p.s. to 111.5 m.c.p.s. with good short term stability. Reference frequency sources 20, in this instance, comprises a variable frequency oscillator 9 (VFO) 24 phase locked to a selected harmonic of a 1 m.c.p.s. frequency standard, preferably a precision crystal oscillator. Both VFO 10 and VFO 24 are adapted to be controlled in frequency by coarse and fine tuning signals. For example, the frequency control circuit in each VFO may include a pair voltage variable capacitors one of the voltage variable capacitors enabling coarse steering of the VFO frequency and the other providing a fine frequency tuning capability. Alternatively, the coarse steering and fine tuning control signals may be combined in a summing network to provide a single tuning voltage. Step tuning selector 12, which may comprise a multitap resistor voltage divider, is connected to the coarse steering inputs of VFO's 10 and 24 and is calibrated to tune both the VFO's simultaneously over the range from 82—110 m.c.p.s. in 1 m.c.p.s. steps.

Phase lock of VFO 24 to obtain a stable reference frequency is provided in the following manner. The output of VFO 24 is coupled through an isolation amplifier to one input of a balanced mixer 30. The other input to mixer 30 comprises a spectrum of frequencies over the band from 50—78 m.c.p.s. as generated by a harmonic generator 32, such as a step recovery diode, driven by crystal oscillator 26, the output of the harmonic generator being coupled to the second input of mixer 30 through a 50—78 m.c.p.s. band-pass filter 34. Mixer 30 produces the difference frequencies resulting from mixing the selected frequency at which VFO 24 is operating within its 82—100 m.c.p.s. range (in 1 m.c.p.s. steps) and the 50—78 m.c.p.s. spectrum. Since a difference frequency of 32 m.c.p.s. will always be present, regardless of the selected VFO operating frequency, a 32 m.c.p.s. amplifier and crystal filter 36 is coupled between the output of mixer 30 and one input of a phase detector 38 for passing that frequency as the feedback comparison signal. To provide a corresponding reference signal, a 32 m.c.p.s. crystal filter 40 is coupled between the output of harmonic generator 32 and the other input of phase detector 38 for passing the 30 second harmonic of crystal oscillator 26. The resulting error signal generated at the output of the phase detector, which is a direct current voltage proportional in magnitude to the phase difference between the two 32 m.c.p.s. inputs, is applied as a phase correction signal to the fine tuning input of VFO 24. In this way, VFO 24 is always maintained in phase lock with a selected harmonic of the frequency standard.

As will now be described, VFO 10 is frequency locked between 500 k.c.p.s. and 1500 k.c.p.s. above the frequency of VFO 24 and is continuously tunable with this range to provide a 1 m.c.p.s. band spread for each 1 m.c.p.s. step of the VFO's. The outputs of VFO's 10 and 24 are coupled through isolation amplifiers 42 and 44 respectively to the inputs of balanced mixer 22. Frequency discriminator 14, in this instance, comprises a constant pulse-width (0.3 μsec.) monostable multivibrator 46 followed by a conventional resistor-capacitor integrator circuit 48. The low difference frequency produced at the output of mixer 22 (the frequency of VFO 10 minus the frequency of VFO 24) is coupled through a broadband preamplifier 50 to the trigger input of monostable 46. The resulting output from the monostable, a series of constant width pulses at a rate equal to the difference frequency, is integrated in circuit 48 to produce a direct current voltage linearly proportional in magnitude to the difference frequency of VFO's 10 and 24. This output of integrator 48 is applied to one input of difference amplifier 16.

The variable tuning voltage for the other input of the difference amplifier is provided by a simple variable resistor voltage divider 18' consisting of a precision potentiometer or a precision resistor decade divider. The end points of variable divider 18' are calibrated such that the direct current voltages produced at the divider output correspond to those obtained from integrator 48 at 500 k.c.p.s. and 1500 k.c.p.s.. Comparison of the magnitudes of the direct current voltages produced by integrator 48 and variable divider 18' in difference amplifier 16 results in a difference signal which is applied to the fine tuning input of VFO 10 to correct its operating frequency accordingly. Any change in the difference frequency of VFO's 10 and 24 will produce a corresponding change in the direct current voltage level from integrator 48. This voltage change will actuate difference amplifier 16 to correct the frequency of VFO 10 so that the amplitude of the direct current voltage from integrator 48 matches the amplitude of the direct current voltage from variable divider 18'. Hence, any adjustment of variable divider 18' will be followed by the operating frequency of VFO 10, and, in view of the aforementioned calibration of the variable divider the frequency of VFO 10 may thereby be varied in a continuous or discrete manner within the 1 m.c.p.s. range from 500 k.c.p.s. to 1500 k.c.p.s. above the frequency of VFO 24. The 500 k.c.p.s. minimum difference frequency established by the one end point of variable divider 18' is sufficient to prevent VFO 10 from locking onto the frequency of VFO 24. Isolation amplifiers 42 and 44 also contribute to this protection from mutual lock on.

By use of the 1 m.c.p.s step tuning selector 12 and the variable resistor voltage divider 18', therefore, VFO 10 may be controlled to provide a continuously tunable synthesized frequency output, via isolation amplifier 52, from 82.5 m.c.p.s. to 111.5 m.c.p.s. with reference to a 1 m.c.p.s. crystal oscillator frequency standard. This relatively simple means of providing a wide range continuous tuning capability, a feature which is particularly desirable in single sideband applications, represents a significant advantage over prior art approaches. Further there are no critical filtering problems. Each of the filters 40 and 36 makes a selection from a spectrum of widely separated frequencies, the separation between spectral lines at the input of each filter being 1 m.c.p.s. in the specific application described. Simple low pass filtering is sufficient at the output of mixer 22; in the specific application described, the preamplifier 50 interstage filters are required to pass frequencies from 500 k.c.p.s. to 1,500 k.c.p.s.

By using a common voltage supply for the frequency discriminator (monostable 46 and integrator 48) and variable divider 18', calibration of the variable divider 18' can be maintained even with small fluctuation of the power supply, since the resulting discriminator and divider output voltage changes will cancel out in the differential amplifier. The automatic correction provided by the frequency lock loop also enables the tolerances of the two VRO's to be relaxed.

In view of the significant reduction in circuit complexity and the simplified voltage divider tuning mechanism employed, the invention provides significant reductions in cost, power requirements and package size over previous techniques. For example, the total power requirement of the synthesizer implementation described with reference to FIG. 2 is approximately 337 milliwatts; two 9-volt batteries would suffice. Further, it is estimated that the synthesizer could be implemented using integrated circuits to provide a total package volume of 3.7 cubic inches.

While particular embodiments of the invention have been illustrated, it will be understood that the applicants do not wish to be limited thereto since modifications will now be suggested to one skilled in the art. For example, variable voltage sources other than precision resistor dividers may be employed for tuning. In some applications coarse tuning may not be required, and the stability of a frequency lock loop not coupled to a reference frequency source may be sufficient. The invention is also suitable for use at frequency ranges other than VHF, and, of course, the filter, oscillator, and tuning frequency ranges may vary accordingly. Reference frequency sources other than a phase locked VFO may be employed, e.g. an oscillator having a bank of switched crystals in its tank circuit may be used. Further, it is clear there are a variety of frequency discriminator designs suitable for this application other than the described monostable integrator combination. Applicants therefore, contemplate by the appended claims to cover all such modifications as fall within the true spirit and scope of this invention.

We claim:

1. A frequency synthesizer comprising, in combination, a first oscillator having an output and adapted to be controlled in frequency by input signals applied thereto, a first mixer having first and second inputs and an output, the output of said first oscillator being coupled to the first input of said first mixer, a reference frequency source coupled to the second input of said first mixer, said reference frequency source being adapted to be controlled in frequency, means for simultaneously tuning said first oscillator and said reference frequency source in coarse frequency steps, a difference amplifier having first and second inputs and an output, a frequency discriminator coupled between the output of said first mixer and the first input of said difference amplifier, a variable tuning voltage source connected to the second input of said difference amplifier, and means connecting the output of said difference amplifier to an input of said first oscillator whereby the frequency of said first oscillator is controlled in response to the difference signal generated from said amplifier.

2. A frequency synthesizer according to claim 1 wherein said first mixer is operative to produce an output which is the difference frequency of the first oscillator and reference frequency inputs thereto, and wherein the variable tuning voltage source connected to the second input of said difference amplifier is calibrated to enable variation of said first oscillator frequency within a selected range, one end point of which establishes a minimum difference frequency sufficient to prevent said first oscillator from locking onto said reference frequency source.

3. A frequency synthesizer according to claim 2 wherein said frequency discriminator comprises a monostable multivibrator, the trigger input of which is coupled to the output of said first mixer, and an integrator circuit connected between the output of said monostable and the first input of said difference amplifier.

4. A frequency synthesizer according to claim 1 wherein said reference frequency source comprises, a second oscillator having an input and adapted to be controlled in frequency and phase by input signals applied thereto, a second mixer having first and second inputs and an output, the output of said second oscillator being coupled in parallel to the second input of said first mixer and the first input of said second mixer, a frequency standard, a harmonic generator driven by said frequency standard, means coupling the output of said harmonic generator to the second input of said second mixer, a phase detector having first and second inputs and an output, a first filter coupled between the output of said harmonic generator and the first input of said phase detector for passing a selected harmonic of said frequency standard, a second filter coupled between the output of said second mixer and the second input of said phase detector for passing the same frequency selected by said first filter, and means connecting the output of said phase detector to an input of said second oscillator whereby the phase of said second oscillator is corrected in response to the error signal generated from said phase detector.

5. A frequency synthesizer according to claim 4 further including means for simultaneously tuning said first and second oscillators in coarse frequency steps.

6. A frequency synthesizer according to claim 5 wherein said frequency discriminator comprises a monostable multivibrator, the trigger input of which is coupled to the output of said first mixer, and an integrator circuit connected between the output of said monostable and the first input of said difference amplifier.

7. A frequency synthesizer according to claim 6 wherein said first mixer is operative to produce an output which is the difference frequency of the first and second oscillator inputs thereto, and wherein the variable tuning voltage source connected to the second input of said difference amplifier comprises a variable resistor voltage divider calibrated to enable variation of said first oscillator frequency within a selected range, one end point of which establishes a minimum difference frequency sufficient to prevent said first oscillator from locking onto said second oscillator.